(12) United States Patent
Berberian et al.

(10) Patent No.: US 7,345,553 B2
(45) Date of Patent: Mar. 18, 2008

(54) METHOD AND APPARATUS FOR REDUCING ERRORS DUE TO LINE ASYMMETRY IN DEVICES UTILIZING COHERENT POPULATION TRAPPING

(75) Inventors: John Edwin Berberian, Dallas, TX (US); Leonard S. Cutler, Los Altos Hills, CA (US); Miao Zhu, San Jose, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 336 days.

(21) Appl. No.: 10/805,005

(22) Filed: Mar. 18, 2004

(65) Prior Publication Data

US 2005/0207456 A1 Sep. 22, 2005

(51) Int. Cl.
*H03B 17/00* (2006.01)
*H03S 1/06* (2006.01)

(52) U.S. Cl. .......................... 331/94.1; 331/3; 372/32
(58) Field of Classification Search .................... 331/3, 331/94.1; 372/32
See application file for complete search history.

(56) References Cited

U.S. PATENT DOCUMENTS

| 6,320,472 B1 * | 11/2001 | Vanier | 331/94.1 |
| 6,363,091 B1 * | 3/2002 | Zhu et al. | 372/32 |
| 6,993,058 B2 * | 1/2006 | Zhu | 372/106 |
| 7,003,438 B1 * | 2/2006 | Dowd et al. | 702/191 |

FOREIGN PATENT DOCUMENTS

WO    WO 01/26231    4/2001

OTHER PUBLICATIONS

Levi, F. et al., :The Light Shift Effect in the Coherent Population Trapping Cessium Maser IEEE Transactions on Ultrasonics, vol. 47, No. 2, Mar. 2000, pp. 466-470.
Kuptsova, A. V., Influence of the Asymmetry of Optical Transitions in a Three-Level Atom on the CPT-Resonance Proceedings of the SPIE, vol. 5067, No. 1, 2003, pp. 209-217.
Zhu M. et al., "Narrow Linewidth CPT Signal in Small Vapor Cells for Chip Scale Atomic Clocks", Freqency Control Symposium and Exposition 2004, pp. 100-103.
Berberian, J. et al., "Methods for Reducing Microwave Resonance Asymmetry in Coherent-Population-Trapping based Frequency Standards", Frequency Symposium and Exposition, 2004, pp. 137-143.

* cited by examiner

*Primary Examiner*—Robert Pascal
*Assistant Examiner*—James Goodley

(57) ABSTRACT

An apparatus and method for measuring CPT is disclosed. The apparatus includes a quantum absorber that is irradiated by radiation from an electromagnetic radiation source. The quantum absorber includes a material that exhibits CPT. The electromagnetic radiation source generates electromagnetic radiation having first and second CPT-generating frequency components. The first CPT-generating frequency component has a frequency $v_L-v$, and a first CPT component amplitude. The second CPT generating frequency component has a frequency $v_L+v$ and a second CPT component amplitude. The apparatus also includes a detector for generating a detector signal related to the power of electromagnetic radiation that leaves the quantum absorber. The detector signal exhibits an asymmetry as a function of frequency $v$ in a frequency range about a frequency $v_0$. The apparatus includes an asymmetry servo loop that alters one of $v_L$, the first CPT component amplitude, and the second CPT component amplitude to reduce the asymmetry.

24 Claims, 6 Drawing Sheets

METHOD AND APPARATUS FOR REDUCING ERRORS DUE TO LINE ASYMMETRY IN DEVICES UTILIZING COHERENT POPULATION TRAPPING

BACKGROUND OF THE INVENTION

To simplify the following discussion, the present invention will first be explained in terms of a frequency standard.

One class of frequency standards utilizes Coherent-Population-Trapping (CPT) in quantum absorbers. CPT-based frequency standards are described in U.S. Pat. Nos. 6,363,091 and 6,201,821, which are hereby incorporated by reference. Since such frequency standards are known to the art, they will not be described in detail here. For the purposes of the present discussion, it is sufficient to note that in such standards, the output of an electromagnetic source that has two frequency components with respective frequencies $v_L+\frac{1}{2}\mu$ and $v_L-\frac{1}{2}\mu$ (CPT-generating frequency components), and possibly other additional components, is applied to a quantum absorber. Here, $v_L$ is the average frequency of the CPT-generating components. The average vacuum wavelength of the electromagnetic source is approximately $c/v_L$, where c is the speed of light in a vacuum. The quantum absorber has two low energy states (which shall be referred to as state A and state B), and n high energy states, each of which can be reached by a transition from state A and by a transition from state B. Denote the high energy states by $C_k$, for $1 \leq k \leq n$. Additionally, the quantum absorber may have any number of other low energy states and high energy states. The mean energy of state B, $E_B$ is taken to be greater than or equal to the mean energy of state A, $E_A$. Denote the frequency difference between state B and state A by $\mu_0 = (E_B-E_A)/h$, where h is Planck's constant.

When the quantities $\mu$ and $\mu_0$ are approximately equal, the quantum absorber can exhibit the phenomenon called Coherent-Population-Trapping (CPT), assuming that the value of $v_L$ falls in the necessary range so that the CPT-generating frequency component with frequency $v_L+\frac{1}{2}\mu$ induces transitions between the state A and the states $C_k$, and the CPT-generating frequency component with frequency $v_L-\frac{1}{2}\mu$ induces transitions between the state B and the states $C_k$. In this situation, the absorption (and fluorescence) of the CPT-generating components by the quantum absorber is smaller than it otherwise would be, and the transmission of the CPT-generating components through the quantum absorber is greater than it otherwise would be. When $\mu$ and $\mu_0$ are exactly equal, for fixed $v_L$, the quantum absorber exhibits an absorption (and fluorescence) minimum, and a transmission maximum, of the CPT-generating components. One class of frequency standards utilizes the CPT phenomenon to adjust a frequency source such that its output frequency is equal to some function of $\mu_0$ by maintaining the frequency $\mu$ at the value that maximizes the transmission (or minimizes fluorescence) of the quantum absorber. If $\mu_0$ remains constant, then the frequency source can be used as a frequency standard having high accuracy, as long as a reliable method exists for determining $\mu_0$.

Therefore, reliably accurate frequency standards based on CPT must keep $\mu_0$ constant, and they must reliably determine the value of $\mu$ that maximizes the transmission through the absorber. To accomplish the first task, each source that causes $\mu_0$ to vary must be carefully controlled, or else means must be applied to the quantum absorber to reduce the sensitivity of $\mu_0$ to that source. For example, if the quantum absorber is $^{87}Rb$ vapor in a cell with a buffer gas and a magnetic field, then some of the sources that cause $\mu_0$ to vary are fluctuations in the strength of the applied magnetic field, and the buffer gas pressure. Hence, reliable operation of the standard must ensure the constancy of the magnetic field and the buffer gas pressure.

For the purposes of the present discussion, it will be assumed that the standard measures the transmission through the quantum absorber. Similar arguments apply to standards that measure fluorescence, microwave emission, or some other parameter. In general, the transmitted power, $T(v_L, \mu)$, will be a function of both $v_L$ and $\mu$. Prior art methods determine the value of $\mu$ that maximizes the transmission by utilizing an algorithm that assumes that the transmission curve is a symmetric function of $\mu$ about $\mu_0$ for fixed $v_L$ when $\mu$ is near to $\mu_0$. If the transmission curve does not satisfy this symmetry condition, the determination of $\mu_0$ will be in error.

In quantum absorbers that exhibit the CPT phenomenon, $T(v_L, \mu)$ is often not a symmetric function of $\mu$ about $\mu_0$ for fixed $v_L$. Denote the Rabi frequency associated with the transition between state A and state $C_k$ by $\omega_{Ak}$ and the Rabi frequency associated with the transition between state B and state $C_k$ by $\omega_{Bk}$. Then the transmission curve $T(v_L, \mu)$, with $v_L$ held fixed, is a symmetric function of $\mu$ about $\mu_0$ only when, for each high energy state $C_k$, $|\omega_{Ak}|^2=|\omega_{Bk}|^2$. When this relation between $\omega_{Ak}$ and $\omega_{Bk}$ does not hold for each of the high energy states $C_k$, then $T(v_L, \mu)$, for $v_L$ held fixed, will not normally be a symmetric function of $\mu$ about $\mu_0$, and an error will be made in the determination of the value of $\mu$ that maximizes the transmission through the quantum absorber.

SUMMARY OF THE INVENTION

The present invention is an apparatus and method for measuring CPT. The apparatus includes a quantum absorber that is irradiated by radiation from an electromagnetic radiation source. The quantum absorber includes a material having first and second low energy states coupled to a common high energy state. Transitions between the first low energy state and the common high energy state or between the second low energy state are induced by electromagnetic radiation. The electromagnetic radiation source generates electromagnetic radiation having first and second CPT-generating frequency components. The first CPT-generating frequency component has a frequency $v_L-v$, and a first CPT component amplitude. The second CPT generating frequency component has a frequency $v_L+v$ and a second CPT component amplitude. The apparatus also includes a detector for generating a detector signal related to the power of electromagnetic radiation that leaves the quantum absorber. The detector signal exhibits an asymmetry as a function of frequency in a frequency range about a frequency $v_0$. The apparatus includes a CPT servo loop that alters $v$ in response to the detector signal and an asymmetry servo loop that alters one of $v_L$, the first CPT component amplitude, and the second CPT component amplitude in a manner that reduces the asymmetry.

In one embodiment, the apparatus includes an EM (ElectroMagnetic) frequency control circuit that determines $v_L$. The EM control circuit is responsive to an EM frequency control signal. In this embodiment, the asymmetry servo loop alters the EM frequency control signal. In another embodiment, the asymmetry servo loop alters one or both of the first CPT component amplitude and the second CPT component amplitude. In one embodiment, the electromagnetic radiation source further generates additional frequency components for altering an AC Stark shift in the quantum absorber, the additional frequency components having amplitudes that are determined by an AC Stark shift control signal. This embodiment includes an AC Stark shift servo loop that generates the Stark shift control signal. In one embodiment, the electromagnetic radiation source includes a source for generating electromagnetic radiation having a frequency $v_L$ in response to a first control signal and a modulator for modulating the generated electromagnetic radiation at a frequency $v$ in response to a second control signal. In one embodiment, the EM radiation source includes a laser.

DETAILED DESCRIPTION OF PREFERRED EMBODIMENTS OF THE INVENTION

To simplify the following discussion, it will be assumed that the CPT-generating frequency components are produced by modulating a laser and utilizing two of the side bands as the CPT-generating components. Systems that generate the CPT-generating components by other methods will be discussed in more detail below. The present invention is based on the observation that the asymmetry in the transmission curve can be reduced by utilizing a servo loop to adjust the laser frequency or the laser modulation parameters. In particular, the Rabi frequencies $\omega_{Ak}$ and $\omega_{Bk}$ for the appropriate values of k can be altered by altering the ratio of the amplitudes of the CPT-generating frequency components in the input light in a manner that reduces the asymmetry in the transmission curve. Alternatively, the center frequency of the laser can be offset to reduce the asymmetry of the transmission curve. In addition, a combination of both servo loops can be utilized.

Figure 1:
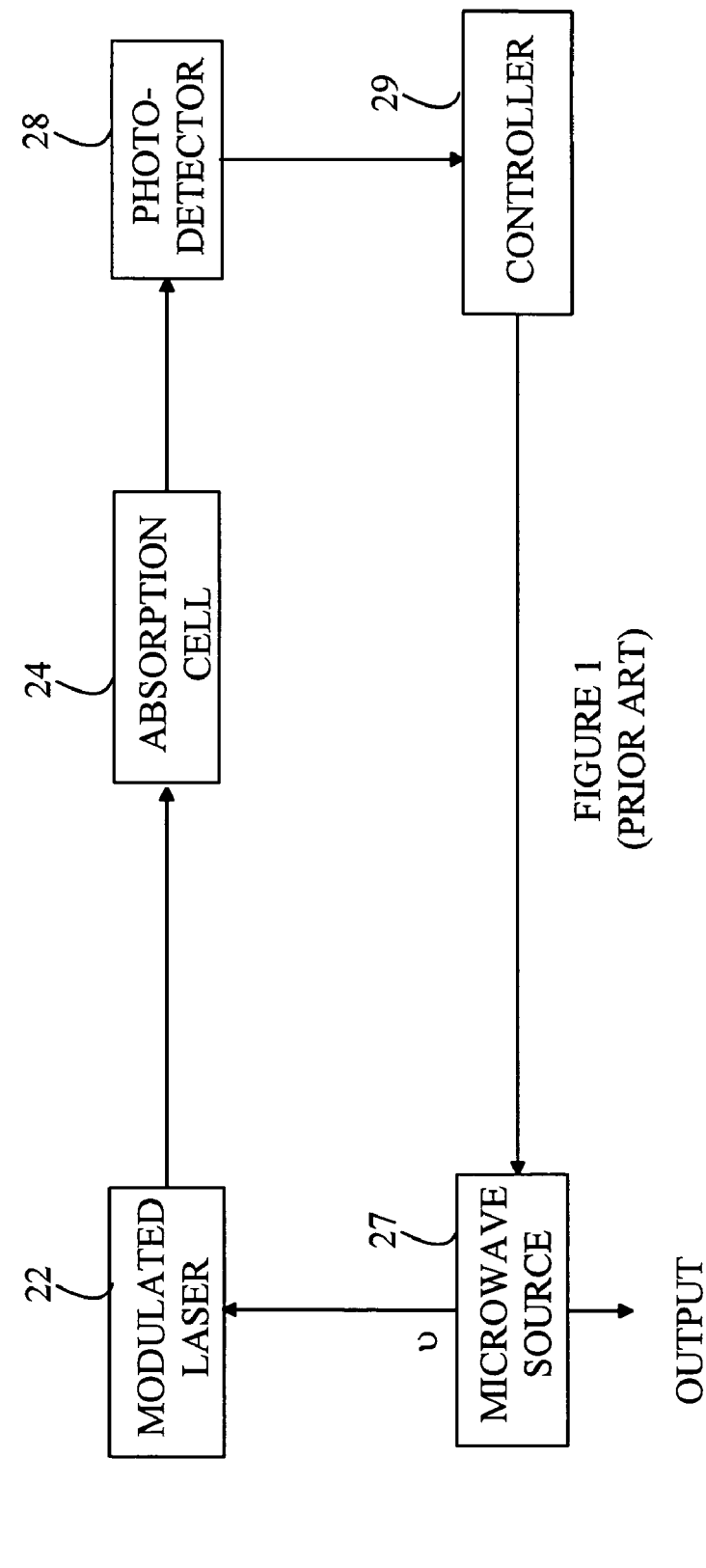
FIG. 1 is a block diagram of a prior art CPT-based reference signal generator.

The manner in which the present invention provides its advantages can be more easily understood with reference to FIG. 1, which is a block diagram of a prior art CPT-based reference signal generator 20. Reference signal generator 20 utilizes a laser 22 that is modulated at a frequency determined by a microwave source 27. The modulation frequency will be denoted by $v$ in the following discussion. The frequency of the laser will be denoted by $v_L$. It should be noted that $v_L$ is also the average of the CPT-generating frequencies in this case. Since laser modulation is well known in the art, a single block 22 representing the modulated laser is shown in FIG. 1. It must be emphasized that the electromagnetic source need not be a modulated laser. The present discussion will use a modulated laser to merely simplify the discussion.

Figure 2:
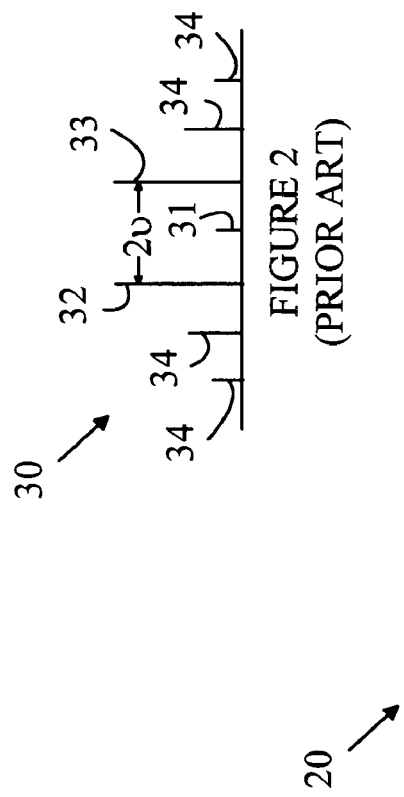
FIG. 2 illustrates the optical spectrum generated by the modulated laser of FIG. 1.

The optical spectrum generated by the modulated laser is shown at 30 in FIG. 2. The spectrum has a number of frequency components. It is possible to choose any two frequency components as CPT-generating components; for the purposes of this discussion, it will be assumed that the CPT-generating frequency components are the first order side bands as shown at 32 and 33 in FIG. 2. In this particular case, $\mu=2v$.

Figure 5:
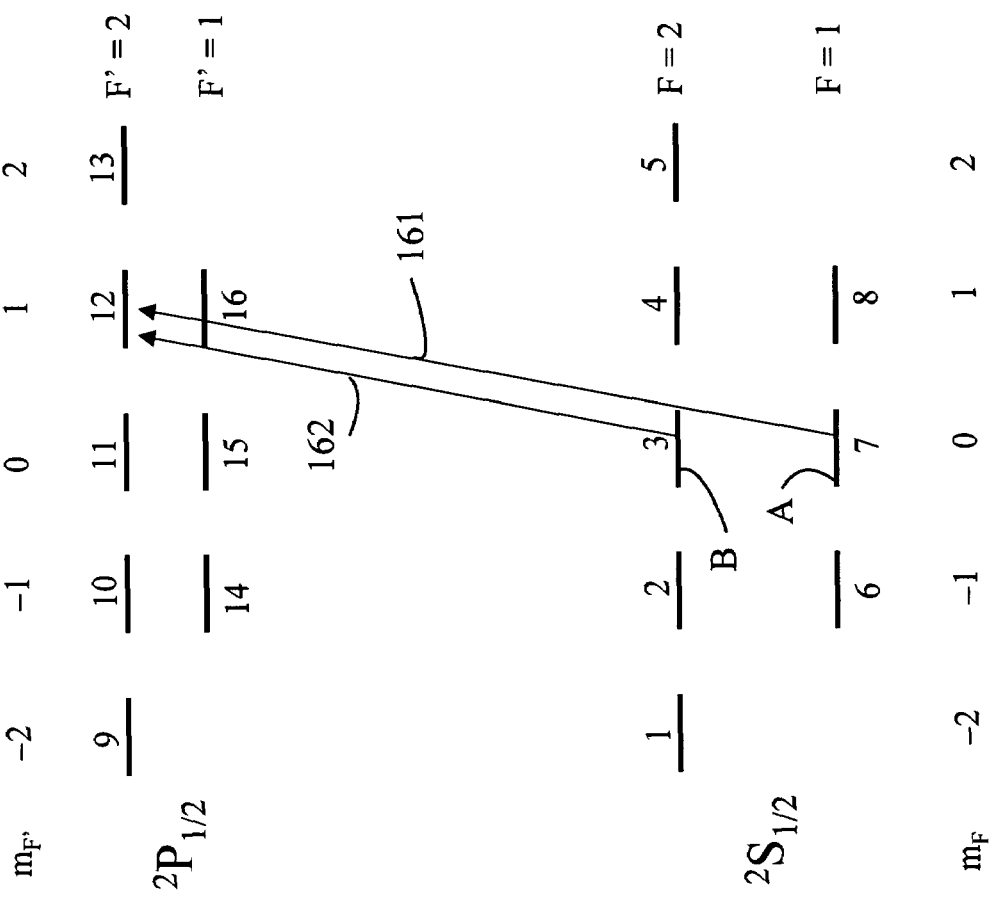
FIG. 5 illustrates some of the energy levels in a typical CPT quantum absorber.

Absorption cell 24 in FIG. 1 contains a quantum absorber having two ground states, state A and state B, that are separated by an energy difference corresponding to a frequency difference $v_0$, and n excited states, each of which can be connected by separate electromagnetic fields to one or both ground states. One such energy level scheme is shown in FIG. 5. One CPT-generating frequency component induces transitions between state A and one of the excited states as shown at 161 and the other CPT-generating frequency component, induces transitions between state B and that same excited state as shown at 162.

The absorption cell has a minimum in its absorption when the frequency difference of the CPT-generating frequency components 32 and 33, i.e., $2v$, is equal to $\mu_0$ provided the laser frequency, $v_L$, is properly set. The intensity of electromagnetic radiation leaving the quantum absorber is sensed by photodetector 28 and controller 29, which sets the value of $v$ to maximize the transmission of cell 24. Hence, by adjusting the microwave frequency $v$ to maximize the light transmitted through absorption cell 24, the frequency of microwave source 27 will be equal to a frequency $v_0$. In this case, the CPT-generating frequency components 32 and 33 are separated by a frequency difference equal to $2v_0$, and $v_0=\mu_0/2$.

The above discussion assumes that the CPT-generating frequency components are the first order sidebands of the modulated laser signal. However, any two frequency components in the modulated light signal can be utilized at the CPT-generating frequency components provided the servo loop can adjust the frequency difference between the two frequency components. For example, standards in which higher order sidebands are utilized can also be constructed. If the $N^{th}$ order side bands are used for the CPT-generating components, the CPT-generating frequency components will be set by the servo loop to a frequency difference of $2Nv_0$, and the frequency of the microwave source 27 would then be $v_0=\mu_0/2N$. Similarly, the laser frequency and one of the side bands could be utilized, or two side bands of different orders could be utilized.

Figure 3:
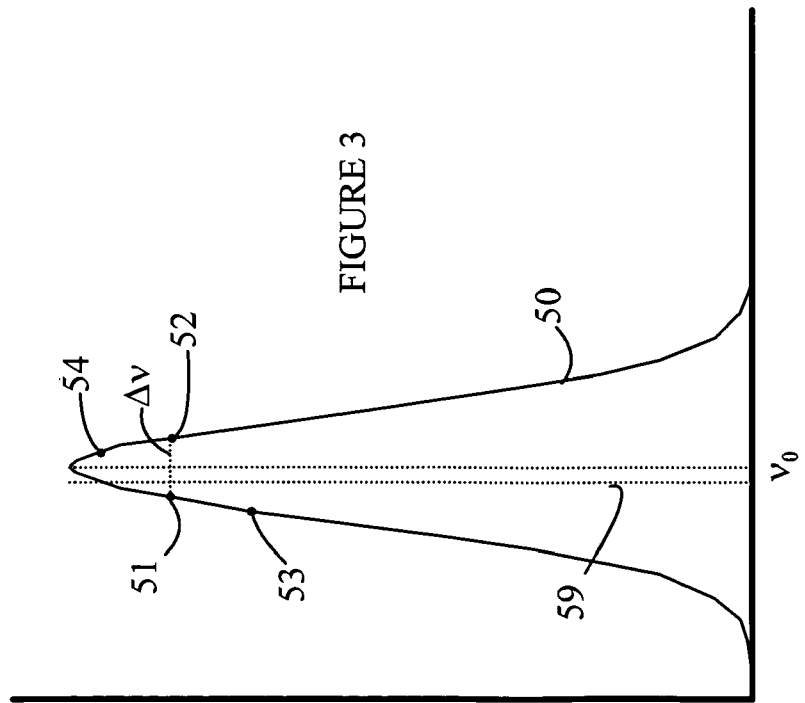
FIG. 3 illustrates a symmetric transmission function.

In the following discussion, $v_0$ will be used for the modulation frequency at which the transmission of the CPT-generating frequency components is maximized for the particular choice of frequency components being used. Denote the optical power transmission through the quantum absorber for a microwave modulation frequency of $v$ by $T_1(v)$. As noted above, $T_1(v)$ has a maximum for $v=v_0$. If, for each k, $|\omega_{Ak}|^2=|\omega_{Bk}|^2$, then function about $v_0$, i.e., $T_1(v)=T_1(2v_0-v)$. Such a transmission function is shown in FIG. 3, which illustrates a transmission function 50. In this case, the servo system can alter the microwave frequency $v$ to keep the frequency set at $v_0$ by measuring the transmission at microwave frequencies $v-\Delta v$ and $v+\Delta v$. If the current setting $v$ is equal to $v_0$, then $T_1(v-\Delta v)=T_1(v+\Delta v)$ as shown at 51 and 52. Suppose $v$ is less than $v_0$, as shown at 59. Then, $T_1(v-\Delta v) < T_1(v+\Delta v)$, as shown at 53 and 54. In this case, the controller increases the current value of $v$. Similarly, if $v>v_0$, then $T_1(v-\Delta v)>T_1(v+\Delta v)$, and the controller decreases the value of $v$.

Unfortunately, electromagnetic sources may generate CPT-generating frequency components whose associated Rabi frequencies in the quantum absorber do not satisfy the condition, $|\omega_{Ak}|^2=|\omega_{Bk}|^2$ for each value of k. In such a case, the transmission curve $T_1(v)$ is rarely symmetric about $v_0$.

Figure 4:
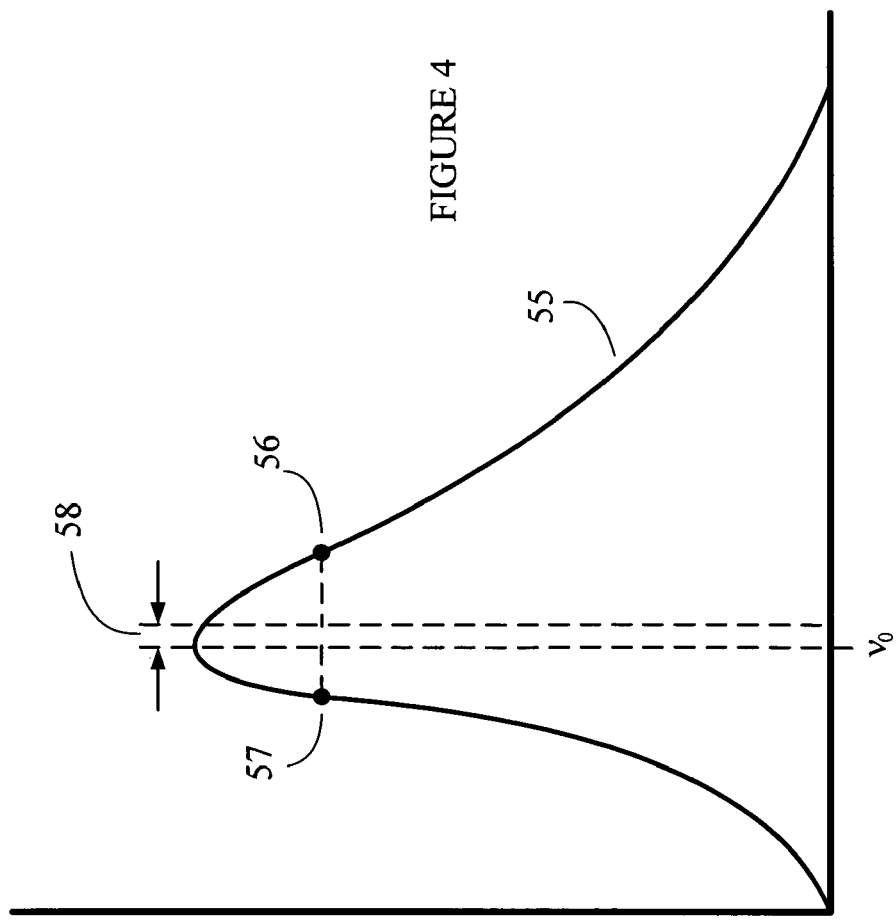
FIG. 4 illustrates the errors that occur when the transmission function is asymmetric.

An asymmetric transmission curve is shown in FIG. 4 at 55. In this example, for increasing v, the transmission curve decreases more slowly than it increases. Consider the two points shown at 56 and 57. These points lie on different sides of the maximum and have equal transmission values. The average of these two points is a frequency that is greater than $v_0$. Hence, if the above-described algorithm is used to determine the location of the maximum, an erroneous result is obtained. The error in frequency is shown at 58. Similar results occur for other types of modulation of the microwave frequency.

The present invention reduces this error either by adjusting the absolute amplitude of each CPT-generating frequency component, or by adjusting the laser frequency $v_L$, in a manner that reduces the asymmetry of the transmission curve even when $|\omega^{Ak}|^2 \neq |\omega_{Bk}|^2$ for some value of k. Embodiments that utilize a combination of these two methods can also be constructed.

The present invention uses a servo loop that generates an error signal that is related to some measure of asymmetry in the transmission curve of the quantum absorber as a function of the microwave frequency. The manner in which one embodiment of an asymmetry detector according to the present invention can be more easily understood with reference to FIG. 6, which illustrates an asymmetric transmission curve 60. It will be assumed that a microwave frequency servo loop has already adjusted v such that points 61 and 62 have the same transmission for some predetermined value of $\Delta v$. The asymmetry error detector measures the transmission at two other points, 63 and 64 that correspond to microwave frequencies of $v \pm \Delta v'$. In one embodiment, the error signal is $T(v+\Delta v')-T(v-\Delta v')$; however, any other suitable function of the difference in transmission at the two points can be utilized.

The above-described asymmetry detector assumes that the microwave frequency has been adjusted in a separate servo loop. That servo loop utilizes an error signal related to the difference in transmissions at points 61 and 62, i.e., $T(v+\Delta v)-T(v-\Delta v)$, to set the value of v.

Figure 7:
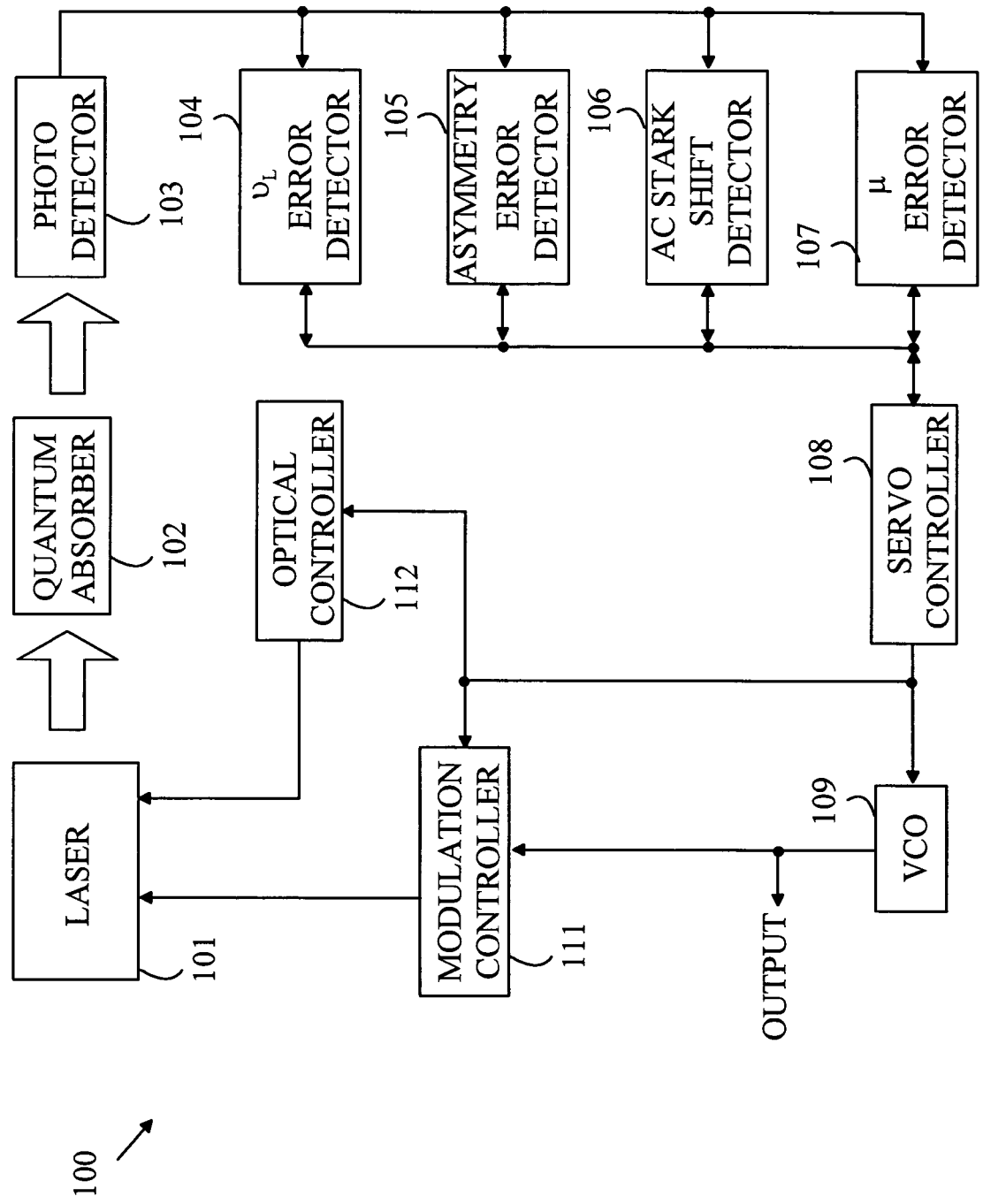
FIG. 7 is a block diagram of a frequency standard according to one embodiment of the present invention.

Refer now to FIG. 7, which is a block diagram of a frequency standard 100 according to one embodiment of the present invention. For the purposes of this example, it will be assumed that the quantum absorber 102 is irradiated with light from a laser 101. However, other forms of electromagnetic radiation can be utilized as discussed below. The power of the light leaving quantum absorber 102 is measured by a photodetector 103 that generates an output signal that is used by various error detectors and servo loops.

Frequency standard 100 controls the amplitude and frequency of the microwave source that modulates the output of laser 101 via modulation controller 111 that controls the modulation amplitude as discussed above. The frequency of the microwaves is set by voltage-controlled oscillator (VCO) 109 in response to control signals from servo controller 108. The frequency and amplitude of the laser output signal are controlled by optical controller 112 in response to signals from servo controller 108.

Figure 6:
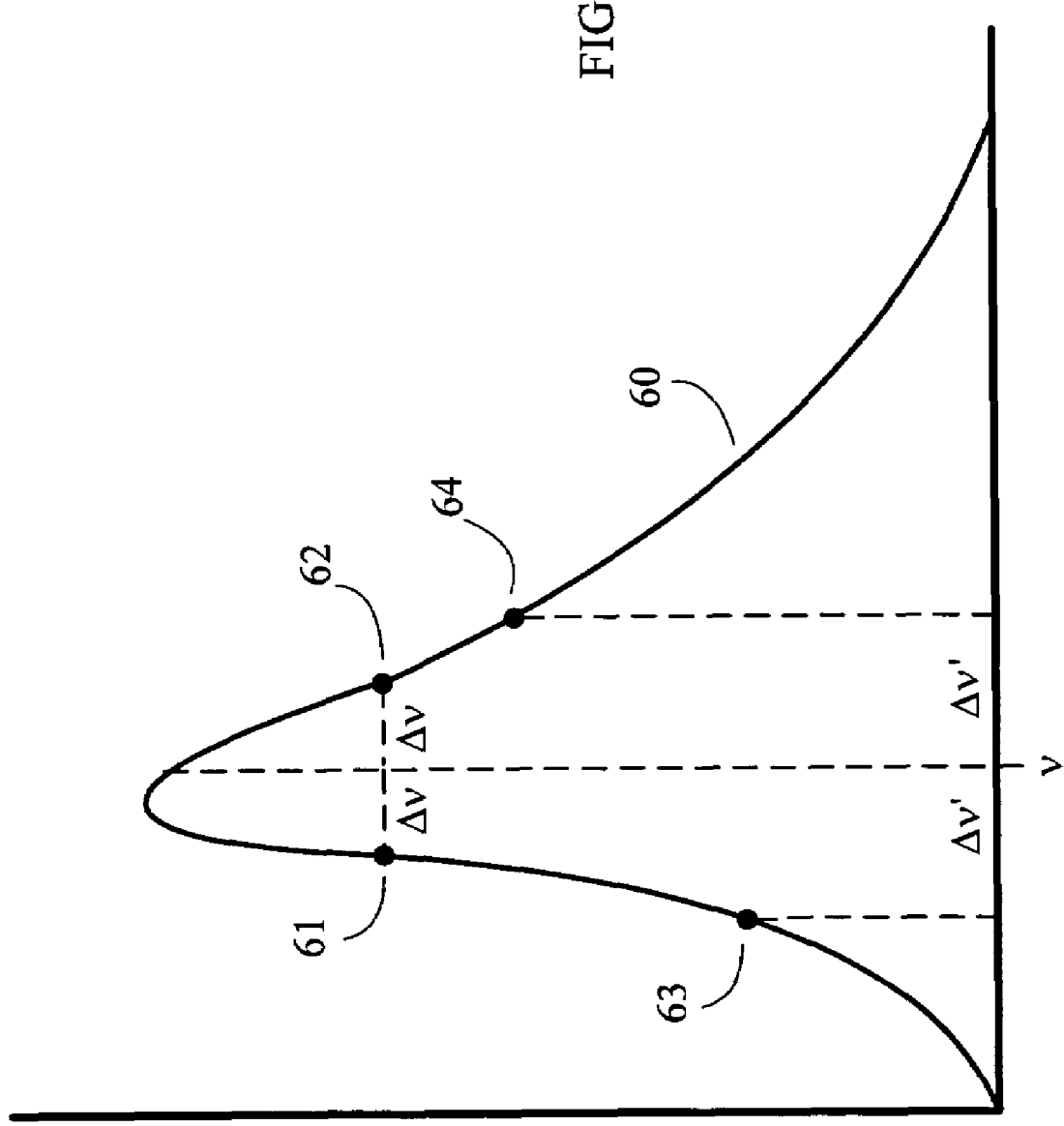
FIG. 6 illustrates an asymmetric transmission function and the points used by some of the servo loops of the present invention.

Frequency standard 100 utilizes four servo loops to stabilize the frequency of the output signal. The first loop sets v by changing the output frequency of VCO 109 until points 61 and 62 shown in FIG. 6 are equal.

The second and third loops set $v_L$. In a conventional CPT-based frequency standard, $v_L$ is set by a single servo loop 104 that adjusts $v_L$ such that the transmission curve as a function of $v_L$ has a minimum. For example, the servo controller causes the laser frequency to be switched back and forth between $v_L+\Delta v_L$ and $v_L-\Delta v_L$. The transmission curve is measured at each of these frequencies and an error signal related to the difference in transmission is used to servo $v_L$. In a conventional CPT-based frequency standard, this assures that the laser frequency is set at the point between the transition frequencies to and from states A and B and the common high energy state discussed above. The present invention is based on the observation that the symmetry of the transmission curve as a function of v can be altered by slightly detuning the laser frequency from this value. The amount of the detuning is determined by asymmetry error detector 105, which generates an error signal related to the difference in transmission that occurs when the microwave source is switched back and forth between $v+\Delta v'$ and $v-\Delta v'$ as discussed above. The asymmetry error signal is used to offset the laser frequency error signal generated by the laser frequency error detector 104 to provide the error signal used to servo the laser frequency.

The fourth servo loop adjusts the amplitude of the microwave modulation signal to reduce errors resulting from the AC Stark Shift. The value of v obtained by the above described three servos depends, in general, on the intensity of the light from laser 101. Hence, fluctuations in the laser intensity lead to fluctuations in the value of v.

One method for reducing the AC Stark shift operates by introducing additional frequency components (AC-Stark-shift-manipulating frequency components) into the applied electromagnetic field. If the AC-Stark-shift-manipulating frequency components have the correct amplitudes and frequencies relative to the amplitudes of the CPT-generating frequency components discussed above, the AC Stark shift is substantially reduced. In this case, the difference in energy between the two low states utilized for the CPT effect will be insensitive to variations in the total light intensity.

If a phase or frequency modulated laser is used to generate the CPT-generating frequency components, all of the non-CPT generating components act as AC Stark-shift manipulating frequency components. The relative intensities of the AC-Stark-shift-manipulating frequency components are controlled by adjusting the amplitude of the microwave signal applied to modulate the laser. The modulation amplitude can be adjusted with a servo loop that utilizes an error signal obtained by switching the laser intensity back and forth between two slightly different intensities and measuring the difference in v obtained at each of these intensities. The difference in the measured value of v is then used to generate an error signal that is used by servo controller 108 to adjust the amplitude of the modulation signal that is applied to laser 101.

Figure 8:
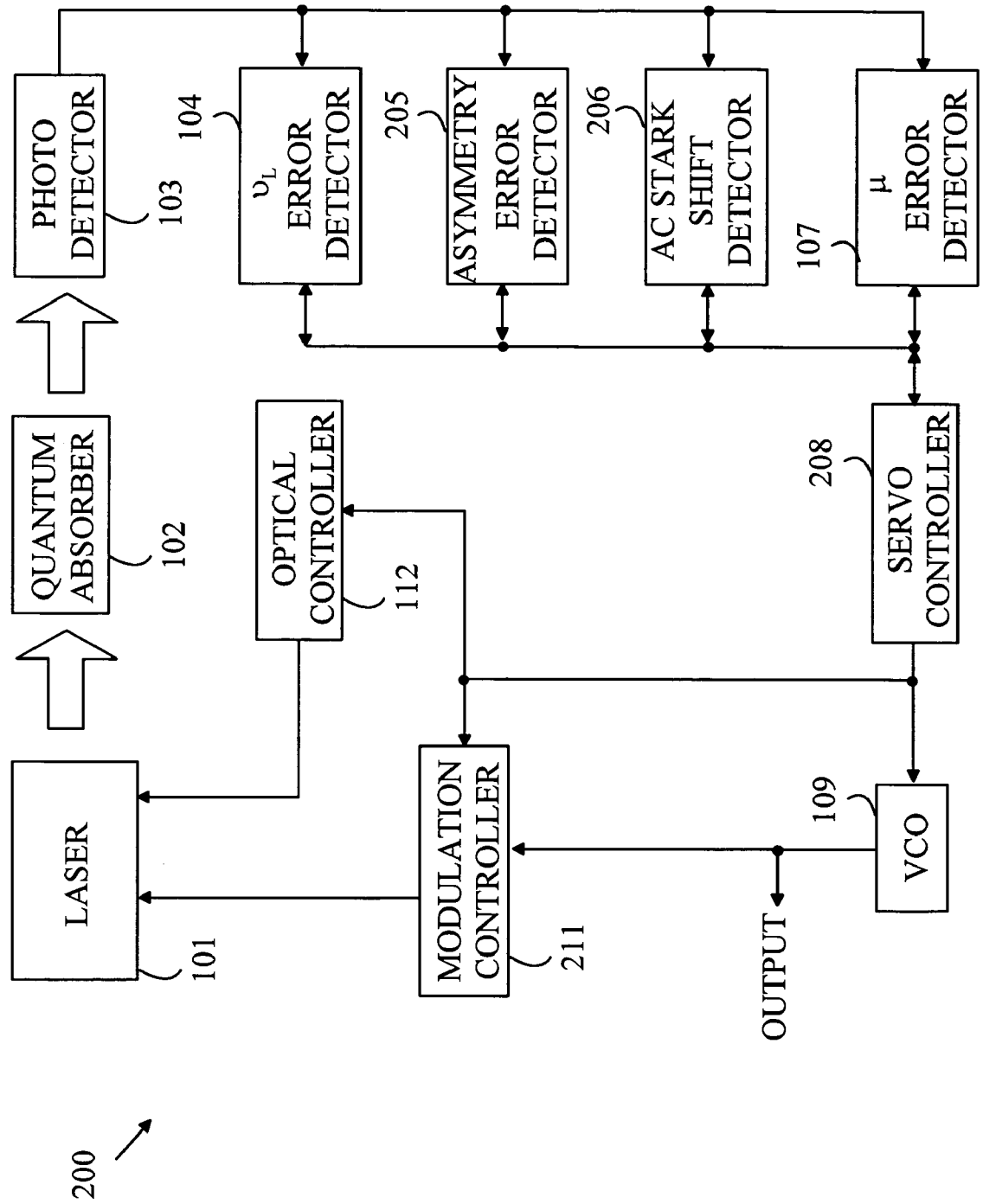
FIG. 8 is a block diagram of a frequency standard according to another embodiment of the present invention.

Refer now to FIG. 8, which is a block diagram of an embodiment of a frequency standard 200 according to another embodiment of the present invention. To simplify the following discussion, those elements of frequency standard 200 that operate in a manner analogous to elements discussed above with reference to FIG. 7 have been given the same numeric designations and will not be discussed in detail here.

Frequency standard 200 alters the amplitudes of the two CPT-generating components to reduce the asymmetry in the transmission function discussed above. The relative amplitudes of the CPT-generating components can be altered by modulating both the amplitude and phase of the laser output. Specifically, the relative amplitudes of the CPT-generating components can be altered by adjusting the depth and/or phase of the amplitude modulation relative to those for the phase modulation. As noted above, the depth of the phase modulation is also used to alter the ratios of the CPT-generating components and the other side bands that are utilized to reduce errors due to the AC Stark Shift discussed above. In frequency standard 200, modulation controller 211 has inputs for controlling the modulation of both the phase and amplitude of the laser. One of these is used to correct for the AC Stark Shift and the other is used to reduce the asymmetry of the transmission curve. The error signal generated by asymmetry error detector 205 is used by servo controller 208 to servo the amplitude modulation, and the error signal generated by AC Stark Shift detector 206 is used to servo the phase modulation.

Since adjusting the amplitudes of the CPT-generating components equalizes the absolute value of the relevant Rabi frequencies, the degree of correction obtained in the second embodiment is, in principle, greater than that obtained by detuning the laser frequency. However, the dynamic range available in the phase or amplitude modulations may not be sufficient to completely equalize the Rabi frequencies in some cases. In such cases, the two strategies can be combined by using the detuning of the laser frequency to reduce the asymmetry to a level that is within the range of the Rabi frequency equalization mechanism.

The above-described embodiments of the present invention utilize a modulated laser as the source of electromagnetic radiation to induce CPT in the quantum absorber. However, other suitable electromagnetic radiation sources can be utilized. For example, a light source can be constructed by phase locking two lasers that differ in frequency by an amount that can be controlled by a servo. In addition, the teachings of the present invention can be applied to electromagnetic radiation sources that are outside the optical range. It should also be noted that the frequency at which the EM source is modulated can be outside the microwave range. Such a case will occur for quantum absorbers in which the low-energy states are separated by frequencies outside of the microwave range.

In the above-described embodiments, the CPT-generating frequency components were two side bands in the modulated laser spectrum. However, as pointed out above, any two frequency components in the spectrum can be utilized. Hence, in the general case, $v_L$ is the average of the two CPT-generating components, and the detuning servo is applied to the controller that determines this average.

Similarly, if two phase-locked lasers are utilized, the detuning servo sets the average frequency of the two lasers. For example, the frequency of one of the lasers can be altered, and the phase-locking circuitry will then move the other laser's frequency to a frequency that maintains the difference in frequency specified by the servo that sets $v$.

The above embodiments of the present invention have been directed to frequency standards in which the goal is to produce a standard signal whose frequency is relatively insensitive to variations in environmental conditions. However, the present invention can also be utilized to construct a sensor that measures some physical quantity such as magnetic field strength. Consider a quantum absorber in which the CPT is based on two low energy states having an energy difference that depends on an external magnetic field that is applied to the quantum absorber. By measuring the modulation frequency at which the CPT is maximized, the strength of the external magnetic field can be deduced.

For example, a magnetic field strength measuring apparatus can be constructed using transitions between states of $^{87}Rb$. The energy levels in the ground states of $^{87}Rb$ shift in response to an external magnetic field that is applied to the atom. If two ground states are chosen in which the energy difference of the ground states is a function of the applied magnetic field, the frequency of the output signal, which is determined by the frequency difference between the two CPT-generating frequency components, can be used to measure the magnetic field. Similar sensors can be constructed to measure electric field strength or other environmental variables by choosing the suitable energy states in a suitable quantum absorber for CPT generation.

The quantum absorber discussed above can be any material that exhibits the CPT effect. For example, alkali metals such as lithium, sodium, potassium, rubidium, and cesium can also be utilized. In addition, suitable ions, molecules, or doped solid materials can be utilized. In particular, ions that are isotopes of $Be^+$, $Mg^+$, $Ca^+$, $Sr^+$, $Ba^+$, $Zn^+$, $Cd^+$, $Hg^+$, and $Yb^+$ can be utilized.

Various modifications to the present invention will become apparent to those skilled in the art from the foregoing description and accompanying drawings. Accordingly, the present invention is to be limited solely by the scope of the following claims.

What is claimed is:

1. An apparatus comprising:
    a quantum absorber comprising a material having first and second low energy states coupled to a common high energy state, transitions between said first low energy state and said common high energy state or between said second low energy state being induced by electromagnetic radiation;
    an electromagnetic radiation source that generates electromagnetic radiation having first and second CPT-generating frequency components, said first CPT-generating frequency component having a frequency $v_L-v$, and a first CPT component amplitude and said second CPT-generating frequency component having a frequency $v_L+v$ and a second CPT component amplitude, said first and second CPT-generating frequency components irradiating said quantum absorber;
    a detector for generating a detector signal related to the power of electromagnetic radiation that leaves said quantum absorber, said detector signal exhibiting an asymmetry as a function of frequency $v$ in a frequency range about a frequency $v_O$;
    a CPT servo loop that alters $v$ in response to said detector signal; and
    an asymmetry servo loop that alters one of $v_L$, said first CPT component amplitude, and said second CPT component amplitude in a manner that reduces said asymmetry.

2. The apparatus of claim 1 further comprising an EM frequency control circuit that determines $v_L$, said EM control circuit being responsive to an EM frequency control signal.

3. The apparatus of claim 2 wherein said asymmetry servo loop alters said EM frequency control signal.

4. The apparatus of claim 1 wherein said electromagnetic radiation source further generates additional frequency components for altering an AC Stark shift in said quantum absorber, said additional frequency components having amplitudes and/or frequencies that are determined by a Stark shift control signal,
    and wherein said apparatus further comprises an AC Stark shift servo loop for generating said Stark shift control signal.

5. The apparatus of claim 1 wherein said electromagnetic radiation source comprises:
    a source that generates electromagnetic radiation having a frequency $v_L$ in response to a first signal; and a modulator that modulates said generated electromagnetic radiation at a frequency determined by a second control signal.

6. The apparatus of claim 5 wherein said modulator also modulates the phase or frequency and amplitude of said generated radiation in a manner determined by a third control signal and wherein said asymmetry servo loop alters one of said second and third control signals.

7. The apparatus of claim 5 wherein said source comprises a laser.

8. The apparatus of claim 1 wherein said electromagnetic radiation source comprises first and second phase-locked lasers.

9. The apparatus of claim 1 wherein said first and second energy states of said quantum absorber differ in energy by an amount that is a function of an externally applied electromagnetic field.

10. The apparatus of claim 1 wherein said quantum absorber comprises hydrogen, or an alkali metal or an ion from group IIA and IIB, or $Yb^+$.

11. The apparatus of claim 10 wherein said alkali metal is an isotope selected from the group consisting of lithium, sodium, potassium, rubidium, and cesium.

12. The apparatus of claim 10 wherein said ion is an isotope selected from the group consisting of $Be^+$, $Mg^+$, $Ca^+$, $Sr^+$, $Ba^+$, $Zn^+$, $Cd^+$, $Hg^+$, and $Yb^+$.

13. A method for measuring CPT comprising:
irradiating a quantum absorber comprising a material having first and second low energy states coupled to a common high energy state, transitions between said first low energy state and said common high energy state or between said second low energy state being induced by electromagnetic radiation with electromagnetic radiation having first and second CPT-generating frequency components, said first CPT-generating frequency component having a frequency $v_L - v$, and a first CPT component amplitude and said second CPT generating frequency component having a frequency $v_L + v$ and a second CPT component amplitude, said first and second CPT-generating frequency components irradiating said quantum absorber;
generating a detector signal related to the power of electromagnetic radiation that leaves said quantum absorber, said detector signal exhibiting an asymmetry as a function of frequency $v$ in a frequency range about a frequency $V_O$;
altering $v$ in response to said detector signal; and
altering one of $v_L$, said first CPT component amplitude, and said second CPT component amplitude in a manner that reduces said measured asymmetry.

14. The method of claim 13 wherein $v_L$ is altered by altering an EM control signal that controls $v_L$ in response to said detector signal.

15. The method of claim 13 further comprising generating additional frequency coinjionents to reduce an AC Stark shift in said quantum absorber.

16. The method of claim 13 wherein said electromagnetic radiation is generated by modulating electromagnetic radiation from an electromagnetic radiation source.

17. The method of claim 16 wherein said electromagnetic radiation source has a frequency $v_L$ and is modulated at a frequency $v$.

18. The method of claim 16 wherein said electromagnetic radiation source comprises a laser.

19. The method of claim 13 wherein said electromagnetic radiation is generated by first and second phase-locked laser.

20. The method of claim 13 wherein said first and second energy states of said quantum absorber differ in energy by an amount that is a function of an externally applied electromagnetic field.

21. The method of claim 13 wherein said quantum absorber comprises hydrogen, an alkali metal or an ion from group IIA and IIB or $Yb^+$.

22. The method of claim 21 wherein said alkali metal is an isotope selected from the group consisting of lithium, sodium, potassium, rubidium, and cesium.

23. The method of claim 21 whereiu said ion is an isotope selected from the group consisting of $Be^+$, $Mg^+$, $Ca^+$, $Sr^+$, $Ba^+$, $Zn^+$, $Cd^+$, $Hg^+$, and $Yb^+$.

24. The method of claim 13 further comprising measuring said asymmetry in said detector signal.

* * * * *